United States Patent
Song et al.

(10) Patent No.: US 8,274,212 B2
(45) Date of Patent: Sep. 25, 2012

(54) ORGANIC LIGHT EMITTING DEVICE INCLUDING FIRST HOLE INJECTION LAYER AND SECOND HOLE INJECTION LAYER

(75) Inventors: Won-Jun Song, Suwon-si (KR); Yeun-Joo Sung, Suwon-si (KR); Mu-Hyun Kim, Suwon-si (KR)

(73) Assignee: Samsung Mobile Display Co., Ltd., Nongseo-Dong, Giheung-Gu, Yongin, Gyunggi-Do (KR)

( * ) Notice: Subject to any disclaimer, the term of this patent is extended or adjusted under 35 U.S.C. 154(b) by 671 days.

(21) Appl. No.: 12/133,824

(22) Filed: Jun. 5, 2008

(65) Prior Publication Data

US 2009/0167160 A1   Jul. 2, 2009

(30) Foreign Application Priority Data

Dec. 28, 2007   (KR) ........................ 10-2007-0140554

(51) Int. Cl.
   *H01J 1/63*   (2006.01)
(52) U.S. Cl. .......... 313/504; 313/506; 313/508; 445/24; 428/690
(58) Field of Classification Search .......... 300/500–512; 313/500–512; 445/24–25; 428/690
See application file for complete search history.

(56) References Cited

U.S. PATENT DOCUMENTS

| | | | |
|---|---|---|---|
| 6,013,384 A | 1/2000 | Kido et al. | |
| 6,396,209 B1 | 5/2002 | Kido et al. | |
| 7,195,829 B2 | 3/2007 | Cosimbescu et al. | |
| 7,297,417 B2 | 11/2007 | Kim et al. | |
| 7,750,560 B2 | 7/2010 | Yamazaki et al. | |
| 2002/0024293 A1 | 2/2002 | Igarashi et al. | |
| 2004/0178720 A1 | 9/2004 | Lee et al. | |
| 2004/0207318 A1 | 10/2004 | Lee et al. | |
| 2005/0037234 A1 | 2/2005 | Kim et al. | |
| 2005/0062406 A1* | 3/2005 | Kinoshita | 313/504 |
| 2005/0106413 A1* | 5/2005 | Tanaka et al. | 428/690 |
| 2005/0221119 A1 | 10/2005 | Cosimbescu et al. | |
| 2006/0008670 A1 | 1/2006 | Lin et al. | |
| 2006/0008740 A1* | 1/2006 | Kido et al. | 430/296 |
| 2006/0131562 A1* | 6/2006 | Li | 257/40 |
| 2006/0214553 A1 | 9/2006 | Nagara et al. | |

(Continued)

FOREIGN PATENT DOCUMENTS

CN   1261760 A   8/2000

(Continued)

OTHER PUBLICATIONS

U.S. Appl. No. 12/133,802, filed Jun. 5, 2008, Song, Won-jun, Samsung SDI Co., Ltd.

(Continued)

*Primary Examiner* — Nimeshkumar Patel
(74) *Attorney, Agent, or Firm* — Robert E. Bushnell, Esq.

(57) ABSTRACT

An organic light emitting device includes a first electrode; a second electrode; an emissive layer disposed between the first electrode and the second electrode; a first hole injection layer disposed between the first electrode and the second electrode; and a second hole injection layer disposed between the first electrode and the second electrode. The first hole injection layer includes a metal fluoride and a first organic hole injection layer forming compound, and the second hole injection layer includes a metal oxide and a second organic hole injection layer forming compound.

15 Claims, 5 Drawing Sheets

U.S. PATENT DOCUMENTS

| | | | |
|---|---|---|---|
| 2006/0279190 A1* | 12/2006 | Nakayama | 313/113 |
| 2006/0286405 A1 | 12/2006 | Begley et al. | |
| 2006/0292394 A1 | 12/2006 | Iwaki et al. | |
| 2007/0020483 A1 | 1/2007 | Park et al. | |
| 2007/0075637 A1 | 4/2007 | Kim et al. | |
| 2007/0090756 A1 | 4/2007 | Okada et al. | |
| 2007/0126348 A1 | 6/2007 | Iou | |
| 2007/0150206 A1 | 6/2007 | Iwaki et al. | |
| 2007/0170843 A1 | 7/2007 | Kawamura et al. | |
| 2007/0181876 A1 | 8/2007 | Itai | |
| 2007/0210303 A1 | 9/2007 | Ikeda et al. | |
| 2007/0222376 A1 | 9/2007 | Ohsawa et al. | |
| 2008/0252199 A1 | 10/2008 | Yamazaki et al. | |
| 2009/0128024 A1 | 5/2009 | Fukuoka et al. | |
| 2009/0167159 A1 | 7/2009 | Song et al. | |
| 2009/0167160 A1 | 7/2009 | Song et al. | |
| 2009/0212688 A1* | 8/2009 | Song et al. | 313/504 |
| 2009/0218934 A1* | 9/2009 | Song et al. | 313/504 |

FOREIGN PATENT DOCUMENTS

| | | |
|---|---|---|
| CN | 1781340 A | 5/2006 |
| CN | 101036246 A | 9/2007 |
| EP | 1 603 174 | 12/2005 |
| EP | 1 617 493 | 1/2006 |
| EP | 1 631 125 | 3/2006 |
| EP | 1 748 504 | 1/2007 |
| EP | 1 748 505 | 1/2007 |
| JP | 10-270172 A | 10/1998 |
| JP | 10270172 A | 10/1998 |
| JP | 2000-182774 | 6/2000 |
| JP | 2000182774 A | 6/2000 |
| JP | 2000-215984 | 8/2000 |
| JP | 20012233084 | 8/2001 |
| JP | 2002056985 | 2/2002 |
| JP | 2003-264083 | 9/2003 |
| JP | 2004-172149 | 6/2004 |
| JP | 2004-296403 | 10/2004 |
| JP | 2004-319424 | 11/2004 |
| JP | 2004-355975 | 12/2004 |
| JP | 2006-24791 | 1/2006 |
| JP | 2006-114521 | 4/2006 |
| JP | 2006-128097 | 5/2006 |
| JP | 2006128097 A | 5/2006 |
| JP | 2006-156344 | 6/2006 |
| JP | 2006-269819 | 10/2006 |
| JP | 2007-5784 | 1/2007 |
| JP | 2007-36175 | 2/2007 |
| JP | 2007502535 A | 2/2007 |
| JP | 2007-134677 | 5/2007 |
| JP | 2007134677 A | 5/2007 |
| JP | 2007-208217 | 8/2007 |
| JP | 2007-287676 | 11/2007 |
| JP | 2007-531316 | 11/2007 |
| KR | 1999-0031395 | 5/1999 |
| KR | 10-0263754 | 5/2000 |
| KR | 2005-15902 | 2/2005 |
| KR | 10-2005-0115472 | 12/2005 |
| KR | 2006-7899 | 1/2006 |
| KR | 2006-42177 | 5/2006 |
| KR | 10-2006-0133521 | 12/2006 |
| KR | 10-2006-0135801 | 12/2006 |
| KR | 10-0672535 | 1/2007 |
| KR | 2007-0013002 | 1/2007 |
| KR | 10-0698300 | 3/2007 |
| KR | 2007-71978 | 7/2007 |
| KR | 2007-0077617 | 7/2007 |
| KR | 2007-0117200 | 12/2007 |
| WO | WO 2004/028217 | 4/2004 |
| WO | WO 2006/109878 | 10/2006 |
| WO | 2007123061 A1 | 11/2007 |
| WO | WO 2007/123061 | 11/2007 |

OTHER PUBLICATIONS

U.S. Appl. No. 12/133,744, filed Jun. 5, 2008, Song, Won-jun, Samsung SDI Co., Ltd.

U.S. Appl. No. 12/211,233, filed Sep. 16, 2008, Song, Won-jun, Samsung SDI Co., Ltd.

U.S. Appl. No. 12/133,843, filed Jun. 5, 2008, Song, Won-jun, Samsung SDI Co., Ltd.

U.S. Appl. No. 12/211,224, filed Sep. 16, 2008, Song, Won-jun, Samsung SDI Co., Ltd.

Walzer, K. et al. "Highly Efficient Organic Devices Based on Electrically Doped Transport Layers." *Chemical Reviews, American Chemical Society*. vol. 107. pp. 1233-1271. Jan. 1, 2007.

Office Action issued in corresponding Korean Patent Application No. 2008-6472618 dated Dec. 29, 2008.

Extended European Search Report issued by the European Patent Office on Jan. 28, 2009.

Registration Determination Certificate issued by the Korean Intellectual Property Office on Apr. 28, 2009.

Communication issued by the European Patent Office on Apr. 29, 2009.

Registration Determination Certificate in corresponding Korean Patent Application No. 10-2007-0136406 dated Aug. 19, 2009.

Registration Determination Certificate issued Sep. 29, 2009, for corresponding Korean Patent Application No. 2009-040241095.

Registration Determination Certificate issued Sep. 30, 2009, for corresponding Korean Patent Application No. 2009-040783883.

Extended European Search Report dated Feb. 11, 2009, issued in corresponding European Patent Application No. 08253275.5.

Korean Office Action dated Apr. 24, 2009, issued in corresponding Korean Patent Application No. 10-2007-0116759.

Japanese Office Action dated Sep. 7, 2010, issued in corresponding Japanese Application No. 2007-278415.

US Office Action dated Aug. 19, 2010, issued in co-pending U.S. Appl. No. 12/133,712.

Japanese Office Action dated Sep. 28, 2010, issued in corresponding Japanese Application No. 2008-270210.

Japanese Office Action dated Sep. 28, 2010, issued in corresponding Japanese Application No. 2008-276076.

Office Action issued in related U.S. Appl. No. 12/133,802 on Apr. 5, 2010.

Office Action issued in related U.S. Appl. No. 12/133,843 on Jul. 12, 2010.

Office Action issued in related U.S. Appl. No. 12/133,744 on Jul. 15, 2010.

Japanese Office action issued by Japanese Patent Office on Jun. 14, 2011, corresponding to JP 2009-040635(Cited in the Information Disclosure Statement of U.S. Appl. No. 12/205,119, filed Aug. 30, 2011).

Japanese Office Action issued by JPO, dated Feb. 8, 2011, corresponding to Japanese Patent Application No. 2009-040635(Cited in the Information Disclosure Statement of U.S. Appl. No. 12/205,119, filed Jun. 24, 2011).

Japanese Office Action issued by Japanese Patent Office on Jun. 14, 2011, corresponding to Japanese Patent Application No. 2008-271210 and Request for Entry of the Accompanying Office Action attached herewith. (Cited in the cross-referenced U.S. Appl. No. 12/133,824 in the Information Disclosure Statement filed on Aug. 29, 2011).

Chinese Office Action issued by Chinese Patent Office on Aug. 24, 2011, corresponding to Chinese Patent Application No. 200810184444.X (Cited in the cross-referenced U.S. Appl. No. 12/133,843 in the Information Disclosure Statement filed on Nov. 10, 2011.) and Request for Entry attached herewith.

* cited by examiner

FIG. 1A

| SECOND ELECTRODE |
| --- |
| ELECTRON TRANSPORT LAYER |
| EMISSIVE LAYER |
| HOLE TRANSPORT LAYER |
| SECOND HOLE INJECTION LAYER |
| FIRST HOLE INJECTION LAYER |
| FIRST ELECTRODE |
| SUBSTRATE |

FIG. 1B

| SECOND ELECTRODE |
| --- |
| ELECTRON INJECTION LAYER |
| ELECTRON TRANSPORT LAYER |
| EMISSIVE LAYER |
| HOLE TRANSPORT LAYER |
| SECOND HOLE INJECTION LAYER |
| FIRST HOLE INJECTION LAYER |
| FIRST ELECTRODE |
| SUBSTRATE |

# ORGANIC LIGHT EMITTING DEVICE INCLUDING FIRST HOLE INJECTION LAYER AND SECOND HOLE INJECTION LAYER

CROSS-REFERENCE TO RELATED APPLICATION

This application claims the benefit of Korean Patent Application No. 2007-140554, filed Dec. 28, 2007, in the Korean Intellectual Property Office, the disclosure of which is incorporated herein by reference.

BACKGROUND OF THE INVENTION

1. Field of the Invention

Aspects of the present invention relate to an organic light emitting device, and more particularly, to an organic light emitting device with improved light-emitting efficiency, lifetime, and the like. In addition, aspects of the present invention may contribute to development of a high image quality organic light emitting device, and provides an organic light emitting device with reduced power consumption and improved lifetime.

2. Description of the Related Art

Organic light emitting devices are devices in which when a current is supplied to an organic layer interposed between two electrodes as shown in FIG. 1, electrons and holes combine in the organic layer to emit light. Such organic light emitting devices can be formed to be light-weight and thin information display devices having a high image quality, quick response time, and wide viewing angles. These features have led to the rapid development of organic light emitting display device technology. Currently, organic light emitting devices are widely applied in mobile phones and other information display devices with high image quality.

Due to such rapid development of organic light emitting devices, competition with other information display devices such as TFT-LCDs is inevitable in terms of academic and industrial technology. In addition, conventional organic light emitting devices are limited in terms of the amount of efficiency and lifetime improvements and power consumption reduction that is possible. The need to improve efficiency and reduce power consumption is an important factor interfering with quantitative and qualitative growth of organic light emitting devices, and it is desirable that this issue be resolved.

SUMMARY OF THE INVENTION

Aspects of the present invention provide an organic light emitting device with high efficiency, low voltage, high luminance, and long lifetime by employing an organic layer comprising a hole injection layer material that has excellent electrical properties and is suitable for use in fluorescence and phosphorescence devices with any kind of colors, such as red, green, blue, white, or the like.

According to an embodiment of the present invention, there is provided an organic light emitting device comprising: a first electrode; a second electrode; an emissive layer disposed between the first electrode and the second electrode; a first hole injection layer disposed between the first electrode and the second electrode; and a second hole injection layer disposed between the first electrode and the second electrode, wherein the first hole injection layer comprises a metal fluoride and a first organic hole injection layer forming compound, and the second hole injection layer comprises a metal oxide and a second organic hole injection layer forming compound.

According to an aspect of the present invention, the mixing molar ratio of the metal fluoride and the first organic compound may be in the range of 1:1 to 3:1.

According to an aspect of the present invention, the mixing molar ratio of the metal oxide and the second organic compound for forming a hole injection layer may be in the range of 1:1 to 3:1.

According to an aspect of the present invention, the thickness ratio of the first hole injection layer to the second hole injection layer may be in the range of 1:99 to 1:9.

According to aspects of the present invention, the hole injection layer forming material according to aspects of the present invention has excellent electrical properties, and is a hole injecting material that is suitable for use in fluorescence and phosphorescence devices with any kind of colors, such as red, green, blue, white, or the like. An organic light emitting device using the hole injecting material can have high efficiency, low voltage, high luminance, and long lifetime.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which:

FIGS. 1A through 1C are schematic cross-sectional views illustrating structures of organic light emitting devices according to embodiments of the present invention;

DETAILED DESCRIPTION OF THE EMBODIMENTS

Figure 1C:
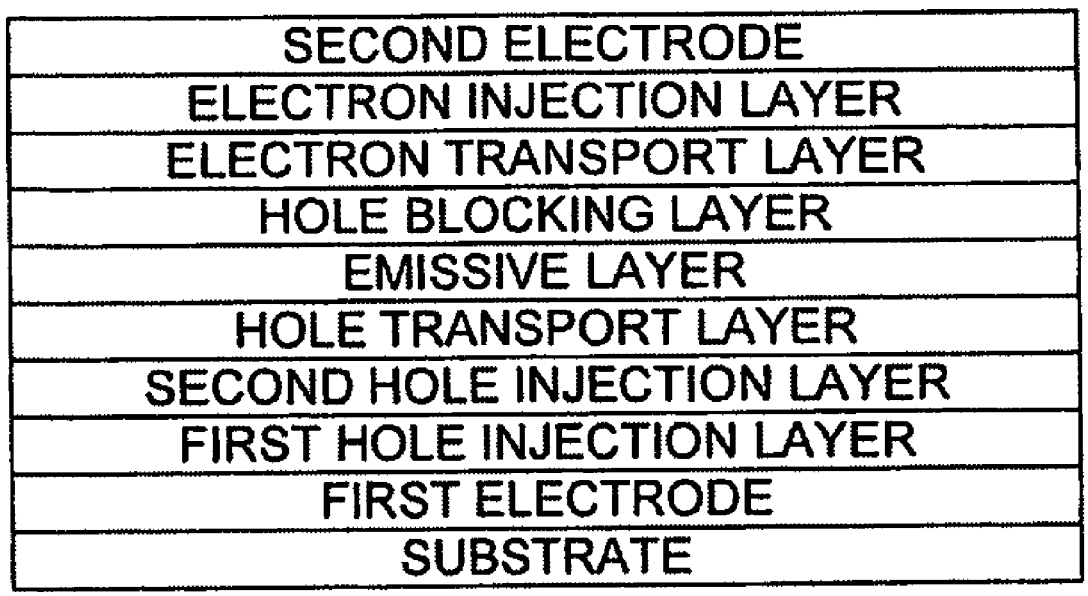

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Aspects of the present invention provide an organic light emitting device including: a first electrode; a second electrode; an emissive layer disposed between the first electrode and the second electrode; a first hole injection layer disposed between the first electrode and the second electrode; and a second hole injection layer disposed between the first electrode and the second electrode. The first hole injection layer comprises a metal fluoride and a first organic hole injection layer forming compound, and the second hole injection layer comprises a metal oxide and a second organic hole injection layer forming compound.

In the organic light emitting device according to aspects of the present invention, the first hole injection layer comprises a mixture of the metal fluoride and the first organic compound, which is a material conventionally used to form a hole injection layer.

Typically, materials used to reduce hole injection barriers have been pure organic-based materials. However, when these materials are used, a energy gap may still exist between electrodes and the organic-based material. When the first hole injection layer comprising the mixture of the metal fluoride and the first organic compound is formed on an interface of an electrode, dipole moments are generated at the interface of the electrode. These dipole moments facilitate hole injection more systematically, when an electric field is applied to the organic light emitting device (induced dipole).

The metal in the metal fluoride may be a Group 1 element or a Group 2 element, as non-limiting examples. As specific, non-limiting examples, the metal fluoride may be LiF, $MgF_2$, BaF, CsF, NaF, $CaF_2$, or the like, and may be prepared using various methods known to one of ordinary skill in the art.

As non-limiting examples, the mixing molar ratio of the metal fluoride to the first organic compound for forming a hole injection layer may be in the range of 1:1 to 3:1. When the mixing molar ratio of the metal fluoride to the first organic compound for forming a hole injection layer is less than 1:1, that is, the first hole injection layer comprises a relatively small amount of the metal fluoride compared to the first organic compound, the effect of a reduction in driving voltage is insignificant and the interface resistance according to time increases. On the other hand, when the mixing molar ratio of the metal fluoride to the first organic compound is greater than 3:1, that is, the first hole injection layer comprises a relatively large amount of the metal fluoride compared to the first organic compound, the driving voltage increases.

In addition, the organic light emitting device according to aspects of the present invention comprises a second hole injection layer. The second hole injection layer comprises a mixture of a metal oxide and a second organic compound, which is a material that is conventionally used material to form a hole injection layer.

When the mixture of the metal oxide and the second organic compound is used in the second hole injection layer, the charge transport density can be increased using the electrical conductivity of the metal oxide, and the intensity of the overall electric field needed for transferring charges can be reduced by decreasing resistance in the organic light emitting device. In addition, an energy trap distribution that exists in an organic compound structure is reduced and the surface morphology is improved, and thus, the contact resistance is reduced, leading to prevention of charge accumulation.

As non-limiting examples, the metal oxide may be molybdenum oxide, tungsten oxide, tin oxide, indium oxide, magnesium oxide, or the like, may be prepared using various methods known to one of ordinary skill in the art.

As described above, the first organic compound and the second organic compound may be each independently a compound known in the art for forming a hole injection layer. For example, the first organic compound and the second organic compound may be each independently copper phthalocyanine, 1,3,5-tricarbazolylbenzene, 4,4'-biscarbazolylbiphenyl, polyvinylcarbazole, m-biscarbazolylphenyl, 4,4'-biscarbazolyl-2,2'-dimethylbiphenyl, 4,4',4"-tri(N-carbazolyl) triphenylamine (TCTA), 4,4',4"-tris(3-methylphenylamino) triphenylamine (m-MTDATA), 1,3,5-tri(2-carbazolylphenyl) benzene, 1,3,5-tris(2-carbazolyl-5-methoxyphenyl)benzene, bis(4-carbazolylphenyl)silane, N,N'-bis(3-methylphenyl)-N, N'-diphenyl-[1,1-biphenyl]-4,4'diamine (TPD), N,N'-di (naphthalene-1-yl)-N,N'-diphenyl benzidine (α-NPD), N,N'-diphenyl-N,N'-bis(1-naphthyl)-(1,1'-biphenyl)-4,4'-diamine (NPB), poly(9,9-dioctylfluorene-co-N-(4-butylphenyl) diphenylamine) (TFB), poly(9,9-dioctylfluorene-co-bis-N, N-phenyl-1,4-phenylenediamine (PFB), or the like.

The organic light emitting device including the first hole injection layer and the second hole injection layer, according to aspects of the present invention has improved driving voltage, light-emitting efficiency, lifetime, and the like. In particular, when the organic light emitting device digitally operates (electrostatically operates), the lifetime reduction is minimized.

Figure 2:
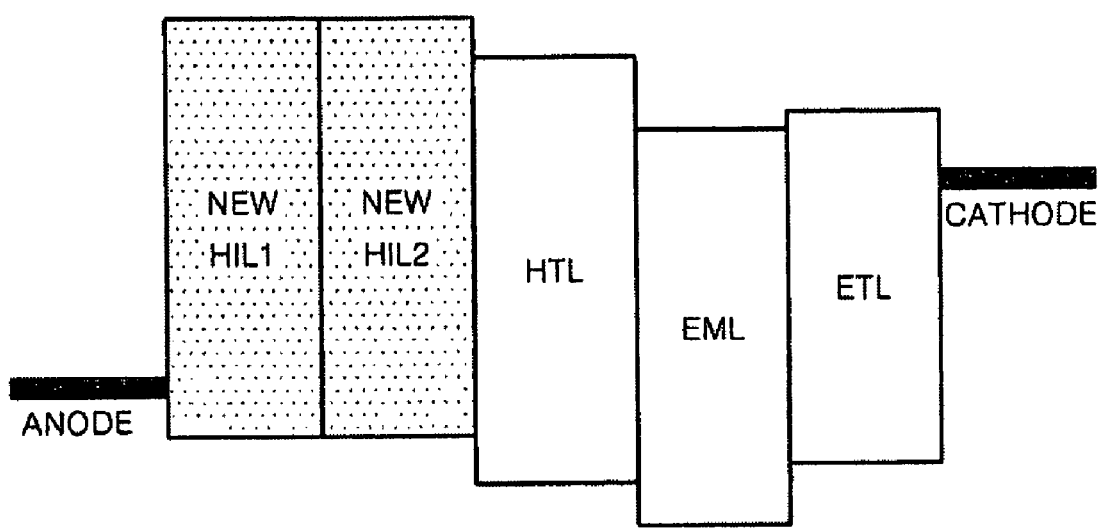
FIG. 2 is an energy band diagram of schematically illustrating differences in HOMO and LUMO levels of layers of an organic light emitting device according to the embodiment of FIG. 1A.

FIG. 2 is an energy band diagram of schematically illustrating differences in highest occupied molecular orbital (HOMO) and lowest unoccupied molecular orbital (LUMO) levels of layers of the organic light emitting device of FIG. 1A.

The organic light emitting device having such structure, according to aspects of the present invention can have reduced charge injection barriers, and also have much longer lifetime by reducing the interface contact resistance when it operates.

As a non-limiting example, the thickness ratio of the first hole injection layer to the second hole injection layer may be in the range of 1:99 to 1:9. When the thickness ratio of the first hole injection layer to the second hole injection layer is less than 1:99, that is, when the thickness of the first hole injection layer is relatively much thinner with respect to the thickness of the second hole injection layer, interface resistance according to stress increases. On the other hand, when the thickness ratio of the first hole injection layer to the second hole injection layer is greater than 1:9, that is, the thickness of the first hole injection layer is not relatively much thinner with respect to the thickness of the second hole injection layer, the effect of a reduction in driving voltage is reduced.

The organic light emitting device according to aspects of the present invention may have a variety of structures. FIGS. 1A through 1C are schematic cross-sectional views illustrating structures of organic light emitting devices according to embodiments of the present invention.

The organic light emitting device may have a structure of an anode, a first hole injection layer (HIL1), a second hole injection layer (HIL2), a hole transport layer (HTL), an emissive layer (EML), an electron transport layer (ETL), an electron injection layer (EIL), and a cathode, as illustrated in FIGS. 1A through 1C. As non-limiting examples, the organic light emitting device may have one of the following structures:

first electrode/first hole injection layer/second hole injection layer/hole transport layer/emissive layer/electron transport layer/second electrode (FIG. 1A);

first electrode/first hole injection layer/second hole injection layer/hole transport layer/emissive layer/electron transport layer/electron injection layer/second electrode (FIG. 1B); or first electrode/first hole injection layer/second hole injection layer/hole transport layer/emissive layer/hole blocking layer/electron transport layer/electron injection layer/second electrode (FIG. 1C).

The organic light emitting device is not limited to these examples and may have other structures or additional layers. For example, the organic light emitting device may further include one-layered or two-layered intermediate layers, if desired.

Hereinafter, a method of manufacturing an organic light emitting device according to an embodiment of the present invention will be described with reference to FIGS. 1A through 1C.

First, a first electrode formed of a material having a high work function is formed on a substrate by deposition or sputtering. The first electrode may be an anode. Herein, the substrate may comprise a substrate material used in conventional organic light emitting devices. For example, the substrate may be a glass substrate or a plastic substrate having good mechanical strength, thermal stability, transparency, surface smoothness, manageability and waterproofness. Specifically, the material for the first electrode can be a transparent and highly conductive material, such as ITO, IZO, $SnO_2$, ZnO, or the like.

Next, a first hole injection layer (HIL) comprising the metal fluoride and the first organic hole injection layer forming compound is formed on the first electrode using a method such as vacuum deposition, spin coating, casting, Langmuir Blodgett (LB) deposition, or the like. For example, the metal fluoride and the first organic compound may be co-deposited.

Next, a second hole injection layer (HIL) comprising the metal oxide and second organic hole injection layer forming compound is formed on the first hole injection layer using a method such as vacuum deposition, spin coating, casting, LB deposition, or the like. For example, the metal oxide and the second organic compound may be co-deposited.

When the first and second hole injection layers are formed by vacuum deposition, the vacuum deposition conditions may vary according to the compound used to form the first and second hole injection layers, and the desired structure and thermal properties of the first and second hole injection layers. In general, the vacuum deposition may be performed at a deposition temperature of 50-500° C., a pressure of $10^{-8}$-$10^{-3}$ torr, and a deposition speed of 0.01-100 Å/sec. The thickness of each of the first and second hole injection layers may be in the range of 10 Å to 5 μm.

Next, a hole transport layer (HTL) is formed on the second hole injection layer using a method such as vacuum deposition, spin coating, casting, LB deposition, or the like. When the HTL is formed by vacuum deposition or spin coating, the deposition and coating conditions may vary according to the compound used to form the HTL. In general, however, the deposition and coating conditions are similar to those used for the formation of the first and second hole injection layers.

The material used to form the HTL may be a material conventionally used to form a hole transport layer, such as, for example, a carbazole derivative such as N-phenylcarbazole, polyvinylcarbazole, or the like, a conventional amine derivative having an aromatic condensation ring, such as N,N'-bis(3-methylphenyl)-N,N'-diphenyl-[1,1-biphenyl]-4,4'-diamine (TPD), N,N'-di(naphthalene-1-yl)-N,N'-diphenyl benzidine (α-NPD), or the like.

An emissive layer (EML) including three different colored regions is formed on the HTL. The material used to form the EML is not particularly limited, and may be selected from a conventional material, a conventional host, and a conventional dopant.

As non-limiting examples material for forming a red emissive layer may be DCM1, DCM2, Eu(thenoyltrifluoroacetone)3 (Eu(TTA)3), butyl-6-(1,1,7,7,-tetramethyljulolidyl-9-enyl)-4H-pyran (DCJTB), or the like. Alternatively, the red emissive layer may be formed using various methods, such as, for example, by doping Alq3 with DCJTB as a dopant, by co-depositing Alq3 and rubrene doping with a dopant, by doping 4,4'-N-N'-dicarbazole-biphenyl (CBP) with BTPIr or RD 61 as a dopant, or the like.

As non-limiting examples, a material for forming a green emissive layer may be coumarin 6, C545T, quinacridone, Ir(ppy)3, or the like. Alternatively, the green emissive layer may be formed of a variety of materials, such as CBP and Ir(ppy)3 as a dopant, Alq3 as a host and a coumarin-based material as a dopant, or the like. In particular, the coumarin-based dopant can be C314S, C343S, C7, C7S, C6, C6S, C314T, or C545T.

As non-limiting examples, a material for forming a blue emissive layer may be, for example, oxadiazole dimer dyes (Bis-DAPOXP)), spiro compounds (Spiro-DPVBi, Spiro-6P), triarylamine compounds, bis(styryl)amine (DPVBi, DSA), compound(A)Flrpic, CzTT, Anthracene, TPB, PPCP, DST, TPA, OXD-4, BBOT, AZM-Zn, aromatic hydrocarbon compounds containing a naphthalene moiety, such as BH-013X (Idemitsu), or the like. Alternatively, the blue emissive layer may include IDE140 (product name, Idemitsu) together with IDE105 (product name, Idemitsu) as a dopant, or the like.

The thickness of the EML may be in the range of 200 to 500 Å, or more specifically, in the range of 300 to 400 Å. In addition, the thickness of the EML in each of the R, G and B regions may be the same or different. When the thickness of the EML is less than 200 Å, the lifetime of the organic light emitting device is decreased; on the other hand, when the thickness of the EML is greater than 500 Å, driving voltage increases.

The EML may be formed using a conventional method such as vacuum deposition, spin coating, casting, LB deposition, or the like. When the EML is formed by vacuum deposition or spin coating, the deposition and coating conditions may vary according to the compound used to form the EML. In general, however, the deposition and coating conditions are similar to those used for the formation of the hole injection layer.

A hole blocking layer (HBL) (not shown) may be optionally formed by vacuum depositing or spin coating a hole blocking material on the EML. Herein, the hole blocking material used is not particularly limited, but should have an electron transporting ability and higher ionization potential than a light-emitting compound. For example, the hole blocking material may be bis(2-methyl-8-quinolato)-(p-phenylphenolato)-aluminum (Balq), bathocuproine (BCP), tris (N-aryl benzimidazole) (TPBI), or the like.

The thickness of the HBL may be in the range of 30 to 60 Å, or more specifically, in the range of 40 to 50 Å. When the thickness of the HBL is less than 30 Å, the hole blocking characteristics may not be well realized; on the other hand, when the thickness of the HBL is greater than 50 Å, the driving voltage may increase.

The HBL may be formed using a conventional method such as vacuum deposition, spin coating, casting, LB deposition, or the like. When the HBL is formed by vacuum deposition or spin coating, the deposition and coating conditions may vary according to the compound used to form the HBL. In general, however, the deposition and coating conditions are similar to those used for the formation of the HIL.

An electron transport layer (ETL) is optionally formed on the EML or the HBL by vacuum depositing or spin coating an electron transporting material. The electron transporting material is not particularly limited, and may be Alq3, or the like.

The thickness of the ETL may be in the range of 100 to 400 Å, or more specifically, in the range of 250 to 350 Å. When the thickness of the ETL is less than 100 Å, an electron transporting rate may be so excessive that the charge balance can be broken, on the other hand, when the thickness of the ETL is greater than 400 Å, the driving voltage may increase.

The ETL may be formed using a conventional method such as vacuum deposition, spin coating, casting, LB deposition, or the like. When the ETL is formed by vacuum deposition or spin coating, the deposition and coating conditions may vary according to the compound used to form the ETL. In general, however, the deposition and coating conditions are similar to those used for the formation of the HIL.

An electron injection layer (EIL) may be formed on the EML, the HBL, or the ETL by vacuum deposition or spin coating. A material for forming the EIL may be $BaF_2$, LiF, NaCl, CsF, $Li_2O$, BaO, lithium quinolate (Liq), or the like; however, the present invention is not limited thereto.

The thickness of the EIL may be in the range of 2 to 10 Å, more specifically in the range of 2 to 5 Å, or even more specifically in the range of 2 to 4 Å. When the thickness of the EIL is less than 2 Å, the EIL cannot effectively function; on the other hand, when the thickness of the EIL is greater than 10 Å, the driving voltage may increase.

The EIL may be formed using a conventional method such as vacuum deposition, spin coating, casting, LB deposition, or the like. When the EIL is formed by vacuum deposition or spin coating, the deposition and coating conditions may vary according to the compound used to form the EIL. In general, however, the deposition and coating conditions are similar to those used for the formation of the HIL.

Next, a material for a second electrode is deposited on the EIL to form the second electrode. Thus, the manufacture of the organic light emitting device is completed.

The material for a second electrode may be a highly conductive and transparent metal oxide, such as ITO, IZO, $SnO_2$, ZnO, or the like. Alternatively, the second electrode may be variously formed as a reflective electrode, semi-transparent electrode, or a transparent electrode by using Li, Mg, Al, Al—Li, Ca, Mg—In, Mg—Ag, Ca, Al, or the like to form a thin film. The material for a second electrode is not limited to the metals and the combinations of the metals described above.

The first electrode and the second electrode can function as an anode and a cathode, respectively; however, the opposite case is also possible. For example, the cathode may be formed on the substrate and the anode may be the last layer that is deposited.

Hereinafter, aspects of the present invention will be described in greater detail with reference to the following examples. The following examples are for illustrative purposes only and are not intended to limit the scope of the invention.

Example

As an anode, a Corning 15 Ω/cm2 (1200 Å) ITO glass substrate was cut to a size of 50 mm×50 mm×0.7 mm, and was ultrasonically washed with isopropyl alcohol and pure water for 5 minutes, respectively. The ITO glass substrate was irradiated with ultraviolet rays for 30 minutes and exposed to ozone and washed, and then installed in a vacuum deposition device.

Then, a metal oxide and NPB were co-deposited on the substrate to form a first hole injection layer with a thickness of 100 Å. Magnesium fluoride and NPB were vacuum co-deposited on the first hole injection layer to form a second hole injection layer with a thickness of 50 Å.

Then, 4,4'-bis[N-(1-naphthyl)-N-phenylamino]biphenyl (NPB) as a hole transporting compound was vacuum deposited on the second hole injection layer to form a hole transport layer with a thickness of 300 Å.

The hole transport layer was doped with a known green fluorescent host, Alq3, and C545T as a dopant to form an emissive layer with a thickness of 250 Å.

Then, Alq3 was deposited on the emissive layer to form an electron transport layer with a thickness of 300 Å, LiF as a halogenated alkali metal was coated on the electron transport layer to form an electron injection layer with a thickness of 10 Å, and then Al (a cathode) was vacuum deposited on the electron injection layer to form a LiF/Al electrode. Thus, the manufacture of the organic light emitting device was completed.

Comparative Example

An organic light emitting device was manufactured in the same manner as in the above Example, except that the hole injection layer was formed in a single layer containing only IDE406 (Idemitsu).

Evaluation Example

Figure 3:
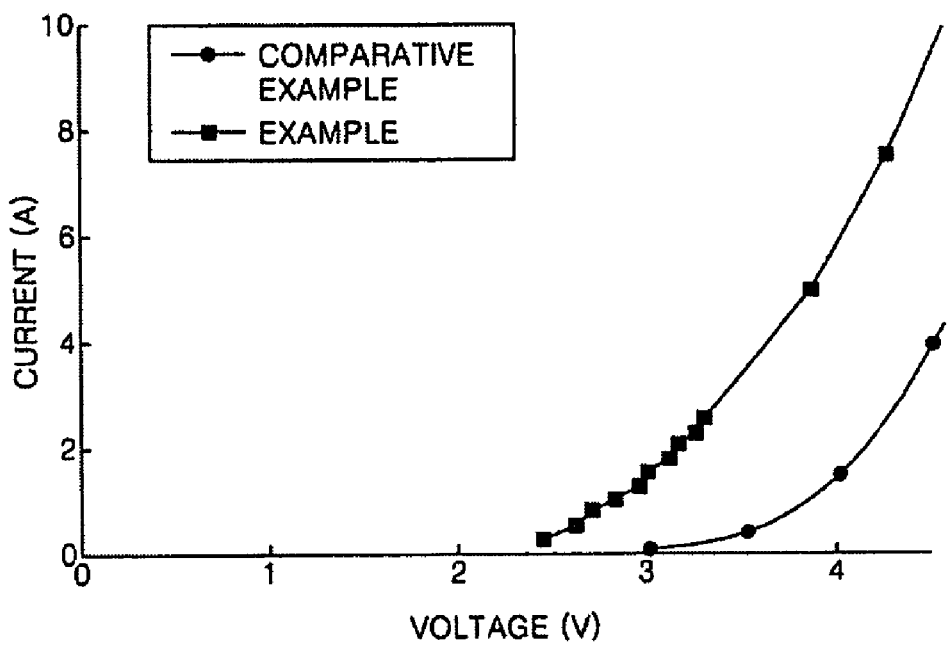
FIG. 3 is a graph showing current density of an organic light emitting device according to the Example and the Comparative Example, respectively.
Figure 4:
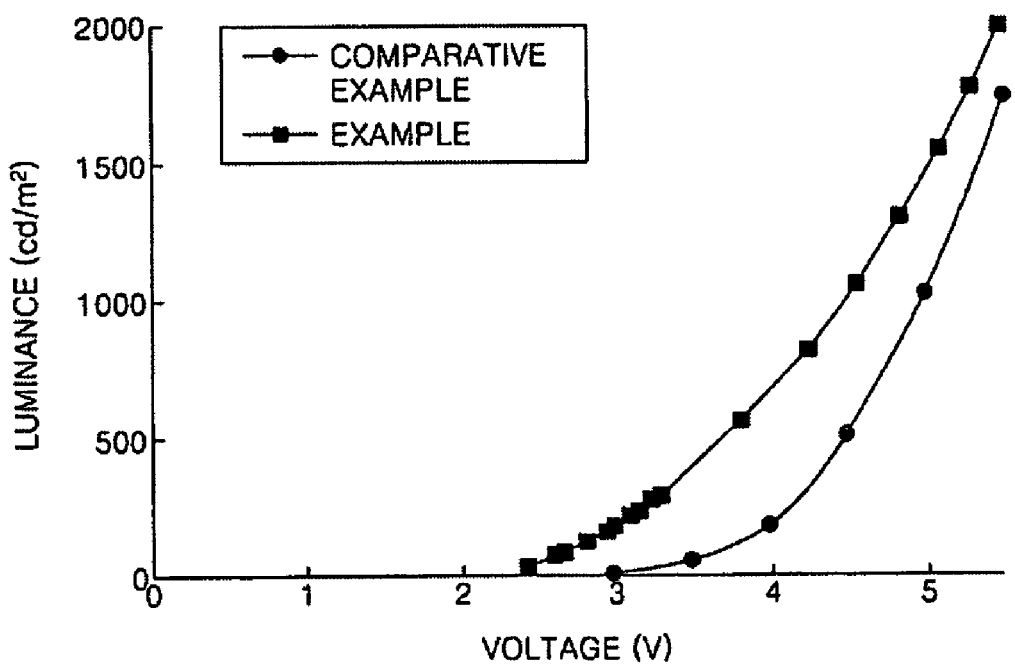
FIG. 4 is a graph showing luminance of an organic light emitting device according to the Example and the Comparative Example, respectively.
Figure 5:
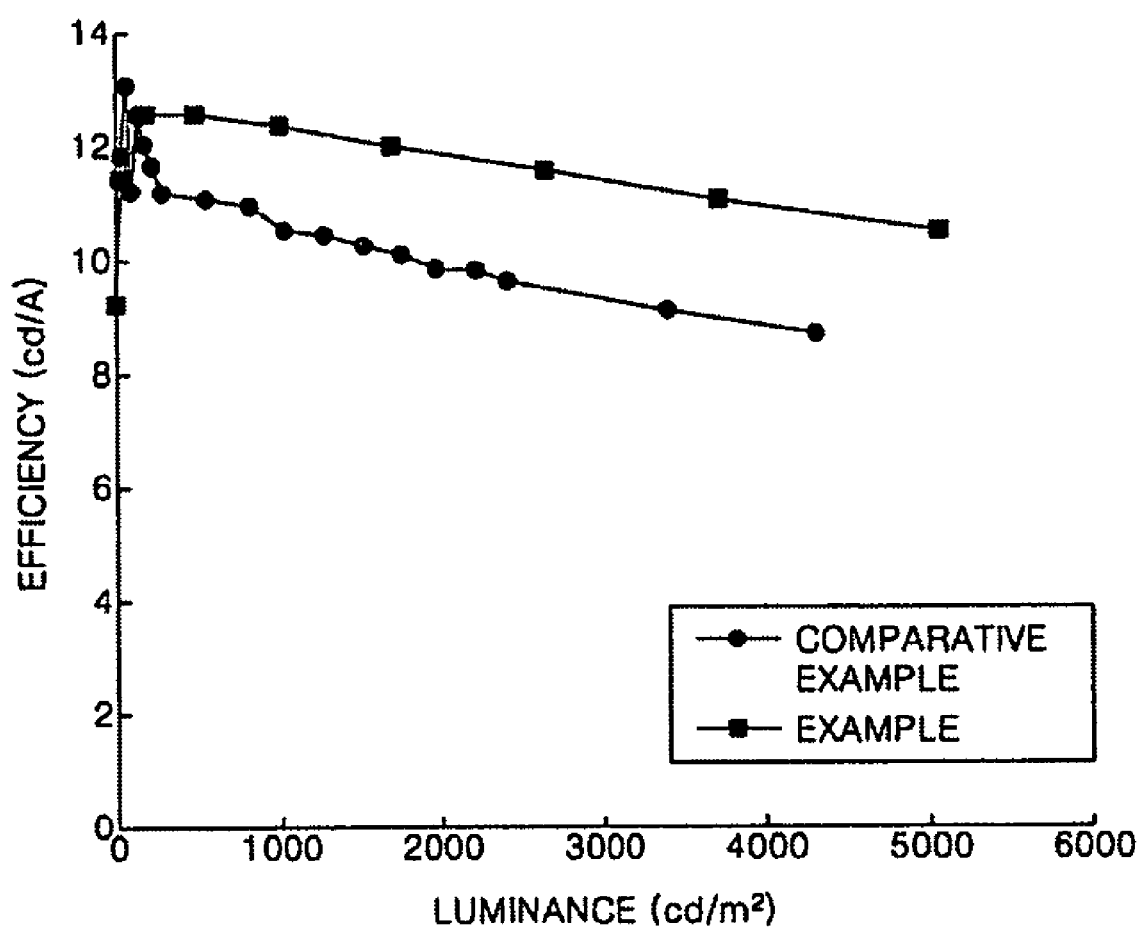
FIG. 5 is a graph showing efficiency of an organic light emitting device according to the Example and the Comparative Example, respectively.

Current density, luminance, and efficiency of each of the organic light emitting devices manufactured in Example and Comparative Example, respectively, were evaluated. FIGS. 3 through 5 are graphs showing the measured current density, luminance, and efficiency of each of the organic light emitting devices manufactured in Example and Comparative Example. A Source Measurement Unit 238 (Keithley) was used in the current density evaluation, and a PR650 (Photo Research, Inc) was used in the luminance and efficiency evaluation tests.

When the material for forming a hole injection layer according to aspects of the present invention was used, the charge injection ability was improved, and thus the driving voltage was reduced at the same current, the current efficiency was improved and the luminance increased. Moreover, the organic light emitting device according to aspects of the present invention had a longer lifetime.

As described above, a material for forming a hole injection layer according to aspects of the present invention has excellent electrical properties, and can be used as a hole injecting material that is suitable for use in fluorescence and phosphorescence devices with any kind of colors, such as red, green, blue, white, or the like. An organic light emitting device using the hole injecting material can have high efficiency, low voltage, high luminance, and long lifetime.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An organic light emitting device, comprising:
a first electrode;
a second electrode;
an emissive layer disposed between the first electrode and the second electrode;
a first hole injection layer disposed between the first electrode and the second electrode; and
a second hole injection layer, wherein the first hole injection layer comprises a metal fluoride and a first organic hole injection layer forming compound, wherein the metal fluoride comprises a metal that is one of a Group 1 element and a Group 2 element, and the second hole injection layer comprises a metal oxide and a second organic hole injection layer forming compound, wherein the second hole injection layer is disposed between the first hole injection layer and the emissive layer, and wherein a thickness ratio of the first hole injection layer to the second hole injection layer is in a range of 1:99 to 1:9; and wherein the first hole injection layer is disposed between the second hole injection layer and an anode so that the second hole injection layer comprising the metal oxide is separate from the anode.

2. The organic light emitting device of claim 1, wherein a mixing molar ratio of the metal fluoride and the first organic hole injection layer forming compound is in a range of 1:1 to 3:1.

3. The organic light emitting device of claim 1, wherein a mixing molar ratio of the metal oxide and the second organic hole injection layer forming compound is in a range of 1:1 to 3:1.

4. The organic light emitting device of claim 1, wherein the metal oxide is selected from a group consisting of tungsten oxide, tin oxide, indium oxide, and magnesium oxide.

5. The organic light emitting device of claim 1, wherein the first organic hole injection layer forming compound and the second organic hole injection layer forming compound are each independently selected from a group consisting of copper phthalocyanine, 1,3,5-tricarbazolylbenzene, 4,4'-biscarbazolylbiphenyl, polyvinylcarbazole, m-biscarbazolylphenyl, 4,4'-biscarbazolyl-2,2'-dimethylbiphenyl, 4,4',4''-tri(N-carbazolyl)triphenylamine (TCTA), 4,4',4''-tris(3-methylphenylamino)triphenylamine(m-MTDATA), 1,3,5-tri(2-carbazolylphenyl)benzene, 1,3,5-tris(2-carbazolyl-5-methoxyphenyl)benzene, bis(4-carbazolylphenyl)silane, N,N'-bis(3-methylphenyl)-N,N'-diphenyl-4,4'diamine (TPD), N,N'-di(naphthalene-1-yl)-N,N'-diphenyl benzidine (α-NPD), N,N'-diphenyl-N,N'-bis(1-naphthyl)-(1,1'-biphenyl)-4,4'-diamine (NPB), poly(9,9-dioctylfluorene-co-N-(4-butylphenyl)diphenylamine) (TFB), and poly(9,9-dioctylfluorene-co-bis-N,N-phenyl-1,4-phenylenediamine (PFB).

6. An organic light emitting device, comprising:
a first electrode;
a second electrode;
an emissive layer disposed between the first electrode and the second electrode;
a first hole injection layer disposed between the first electrode and the second electrode; and
a second hole injection layer, wherein the first hole injection layer comprises a metal fluoride and a first organic hole injection layer forming compound, wherein the metal fluoride comprises a metal that is one of a Group 1 element and a Group 2 element, and the second hole injection layer comprises a metal oxide and a second organic hole injection layer forming compound, wherein the first electrode is an anode and the second electrode is a cathode, wherein the second hole injection layer is disposed between the first hole injection layer and the emissive layer, and wherein a thickness ratio of the first hole infection layer to the second hole injection layer is in a range of 1:99 to 1:9; and wherein the first hole injection layer is disposed between the second hole injection layer and an anode so that the second hole injection layer comprising the metal oxide is separate from the anode.

7. The organic light emitting device of claim 1, further comprising at least one layer selected from a group consisting of a hole transport layer, an electron blocking layer, a hole blocking layer, an electron transport layer, and an electron injection layer.

8. The organic light emitting device of claim 1, having one of the following structures:
first electrode/first hole injection layer/second hole injection layer/hole transport layer/emissive layer/electron transport layer/second electrode;
first electrode/first hole injection layer/second hole injection layer/hole transport layer/emissive layer/electron transport layer/electron injection layer/second electrode; or
first electrode/first hole injection layer/second hole injection layer/hole transport layer/emissive layer/hole blocking layer/electron transport layer/electron injection layer/second electrode.

9. The organic light emitting device of claim 1, wherein the first hole injection layer is disposed directly on the first electrode.

10. The organic light emitting device of claim 1, wherein the second hole injection layer is spaced-apart from the first electrode by the first hole injection layer.

11. The organic light emitting device of claim 6, wherein the first hole injection layer is arranged directly on the first electrode.

12. The organic light emitting device of claim 6, wherein a mixing molar ratio of the metal fluoride and the first organic hole injection layer forming compound is in a range of 1:1 to 3:1.

13. The organic light emitting device of claim 6, wherein a mixing molar ratio of the metal oxide and the second organic hole injection layer forming compound is in a range of 1:1 to 3:1.

14. An organic light emitting device, comprising:
a first electrode;
a second electrode;
an emissive layer disposed between the first electrode and the second electrode;
a first hole injection layer disposed between the first electrode and the second electrode; and
a second hole injection layer, wherein the first hole injection layer comprises a metal fluoride and a first organic hole injection layer forming compound, wherein the metal fluoride comprises a metal that is one of a Group 1 element and a Group 2 element, and the second hole injection layer comprises a metal oxide and a second organic hole injection layer forming compound, wherein the first electrode is an anode and the second electrode is a cathode, wherein the second hole injection layer is disposed between the first hole injection layer and the emissive layer;
wherein a mixing molar ratio of the metal fluoride and the first organic hole injection layer forming compound is in a range of 1:1 to 3:1; and
wherein the first hole injection layer is disposed between the second hole injection layer and the anode so that the second hole injection layer comprising the metal oxide is separate from the anode.

15. An organic light emitting device, comprising:
a first electrode;
a second electrode;
an emissive layer disposed between the first electrode and the second electrode;
a first hole injection layer disposed between the first electrode and the second electrode; and
a second hole injection layer, wherein the first hole injection layer comprises a metal fluoride and a first organic hole injection layer forming compound, wherein the metal fluoride comprises a metal that is one of a Group 1 element and a Group 2 element, and the second hole injection layer comprises a metal oxide and a second organic hole injection layer forming compound, wherein the first electrode is an anode and the second electrode is a cathode, wherein the second hole injection layer is disposed between the first hole injection layer and the emissive layer;

wherein a mixing molar ratio of the metal oxide and the second organic hole injection layer forming compound is in a range of 1:1 to 3:1; and wherein the first hole injection layer is disposed between the second hole injection layer and the anode so that the second hole injection layer comprising the metal oxide is separate from the anode.

\* \* \* \* \*